(12) United States Patent
Matsuda et al.

(10) Patent No.: US 10,079,184 B2
(45) Date of Patent: Sep. 18, 2018

(54) SEMICONDUCTOR MANUFACTURING APPARATUS AND METHOD OF MANUFACTURING SEMICONDUCTOR DEVICE

(71) Applicant: Toshiba Memory Corporation, Minato-ku (JP)

(72) Inventors: Yuya Matsuda, Mie (JP); Ryo Suemitsu, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 485 days.

(21) Appl. No.: 14/730,446

(22) Filed: Jun. 4, 2015

(65) Prior Publication Data
US 2016/0240446 A1 Aug. 18, 2016

(30) Foreign Application Priority Data
Feb. 17, 2015 (JP) ................. 2015-028894

(51) Int. Cl.
*H01J 37/32* (2006.01)
*H01L 21/66* (2006.01)

(52) U.S. Cl.
CPC ........ *H01L 22/26* (2013.01); *H01J 37/32963* (2013.01); *H01J 37/32972* (2013.01); *H01J 2237/24564* (2013.01)

(58) Field of Classification Search
CPC ........... H01J 37/32963; H01J 37/32972; H01J 2237/334; H01J 2237/24564; H01L 22/26; H01L 22/12
See application file for complete search history.

(56) References Cited

U.S. PATENT DOCUMENTS

| 5,837,617 | A | 11/1998 | Oguri et al. | |
| 6,104,487 | A * | 8/2000 | Buck | G01N 21/68 216/60 |
| 6,153,897 | A | 11/2000 | Oguri et al. | |
| 6,207,008 | B1 | 3/2001 | Kijima | |
| 2004/0175913 | A1 * | 9/2004 | Johnson | H01J 37/32935 438/610 |

(Continued)

FOREIGN PATENT DOCUMENTS

| JP | 06-314668 | 11/1994 |
| JP | 07-74466 | 8/1995 |

(Continued)

*Primary Examiner* — Yuechuan Yu
(74) *Attorney, Agent, or Firm* — Oblon, McClelland, Maier & Neustadt, L.L.P.

(57) ABSTRACT

According to one embodiment, a semiconductor manufacturing apparatus includes a manufacturing processor, a signal acquisition unit, a frequency characteristic acquisition unit, and an end-point acquisition unit. The signal acquisition unit acquires a first processing signal which shows a different behavior during processing of a stacked body and after the processing of the stacked body. The frequency characteristic acquisition unit acquires a frequency characteristic of a noise caused by a periodic structure of the stacked body from the first processing signal during the processing of the stacked body. The end-point acquisition unit detects an end point of the processing using the acquired frequency characteristic. The manufacturing processor ends the processing when the end point is detected.

8 Claims, 13 Drawing Sheets

(56) References Cited

U.S. PATENT DOCUMENTS

2010/0216263 A1  8/2010  Daniels et al.

FOREIGN PATENT DOCUMENTS

| JP | 08-124904 | 5/1996 |
| JP | 8-306648 A | 11/1996 |
| JP | 11-176815 | 7/1999 |
| JP | 2009-28856 A | 2/2009 |
| JP | 2010-518597 | 5/2010 |
| JP | 2010-219200 | 9/2010 |
| WO | WO 2008/092936 A2 | 8/2008 |

* cited by examiner

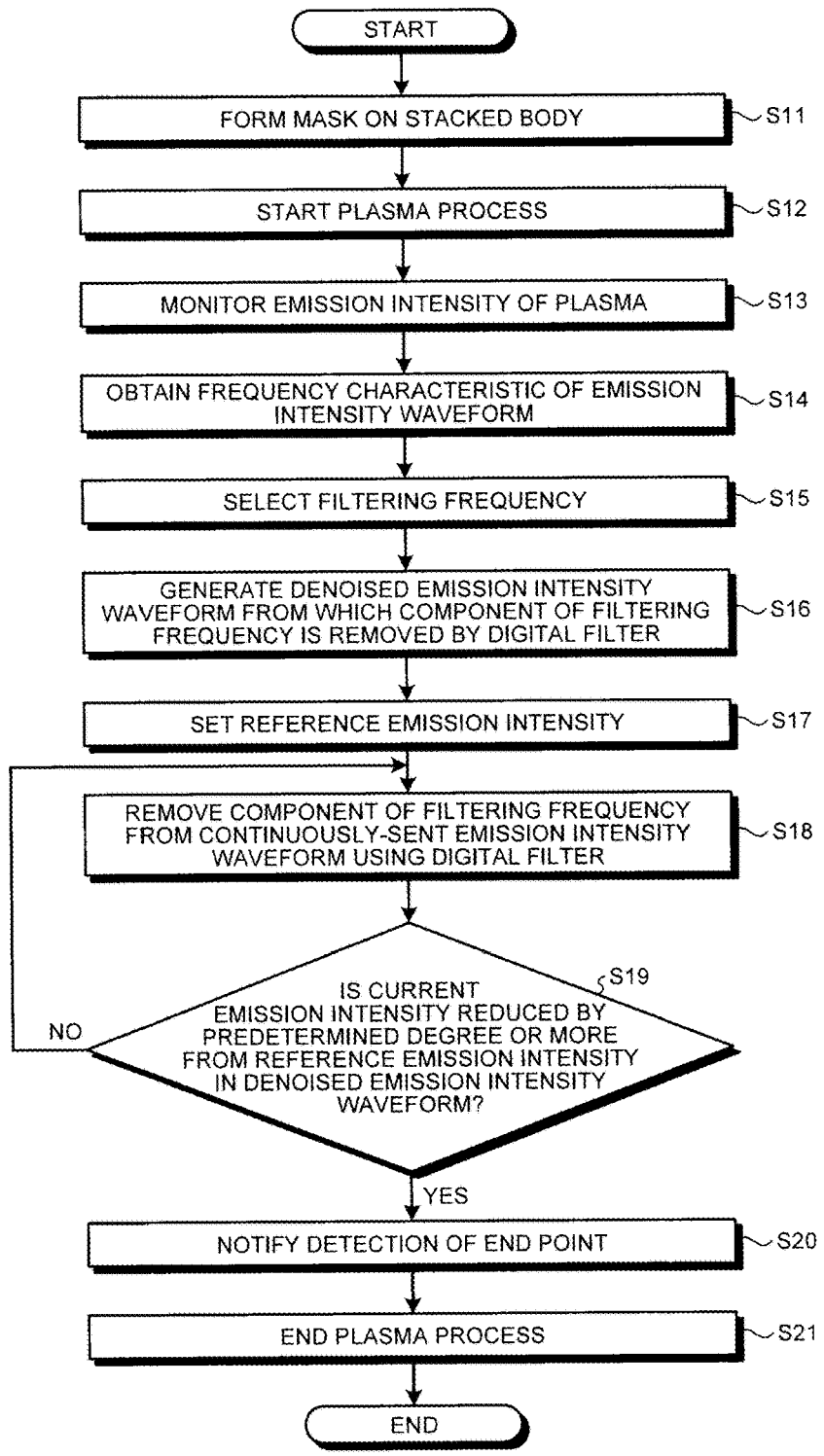

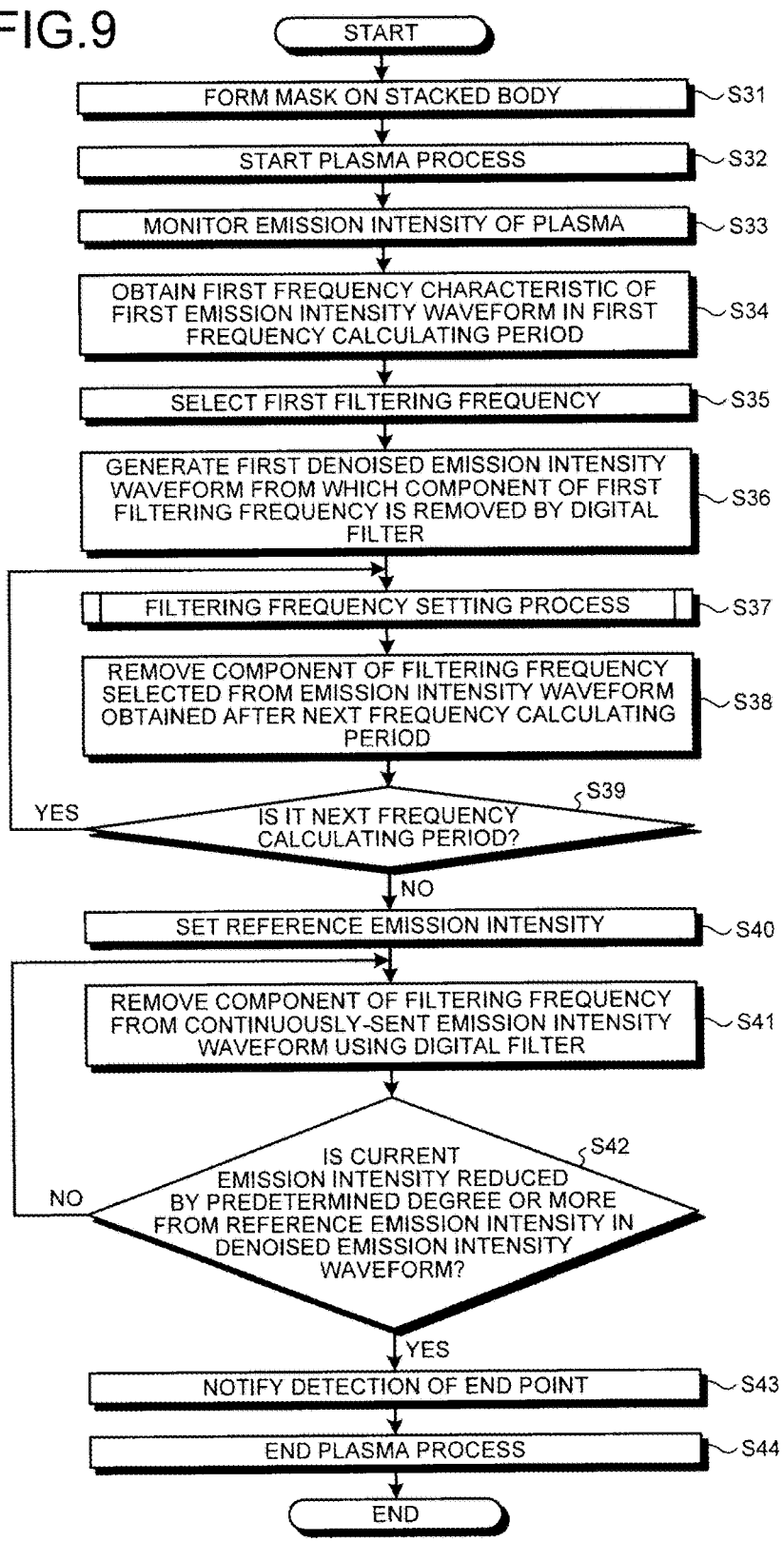

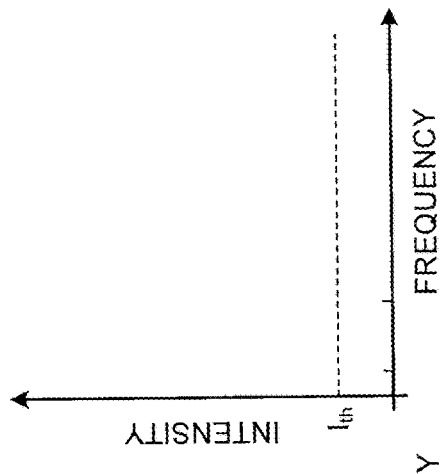
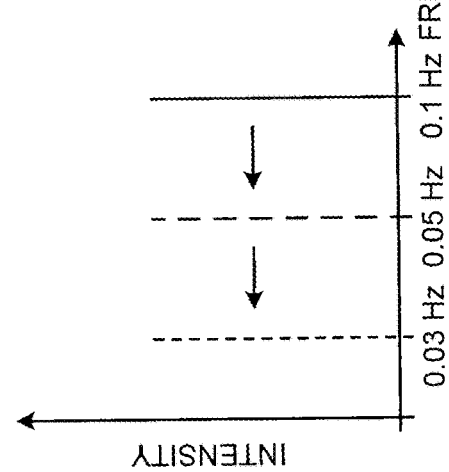
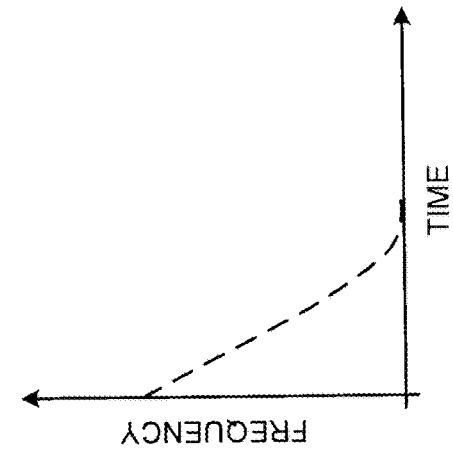

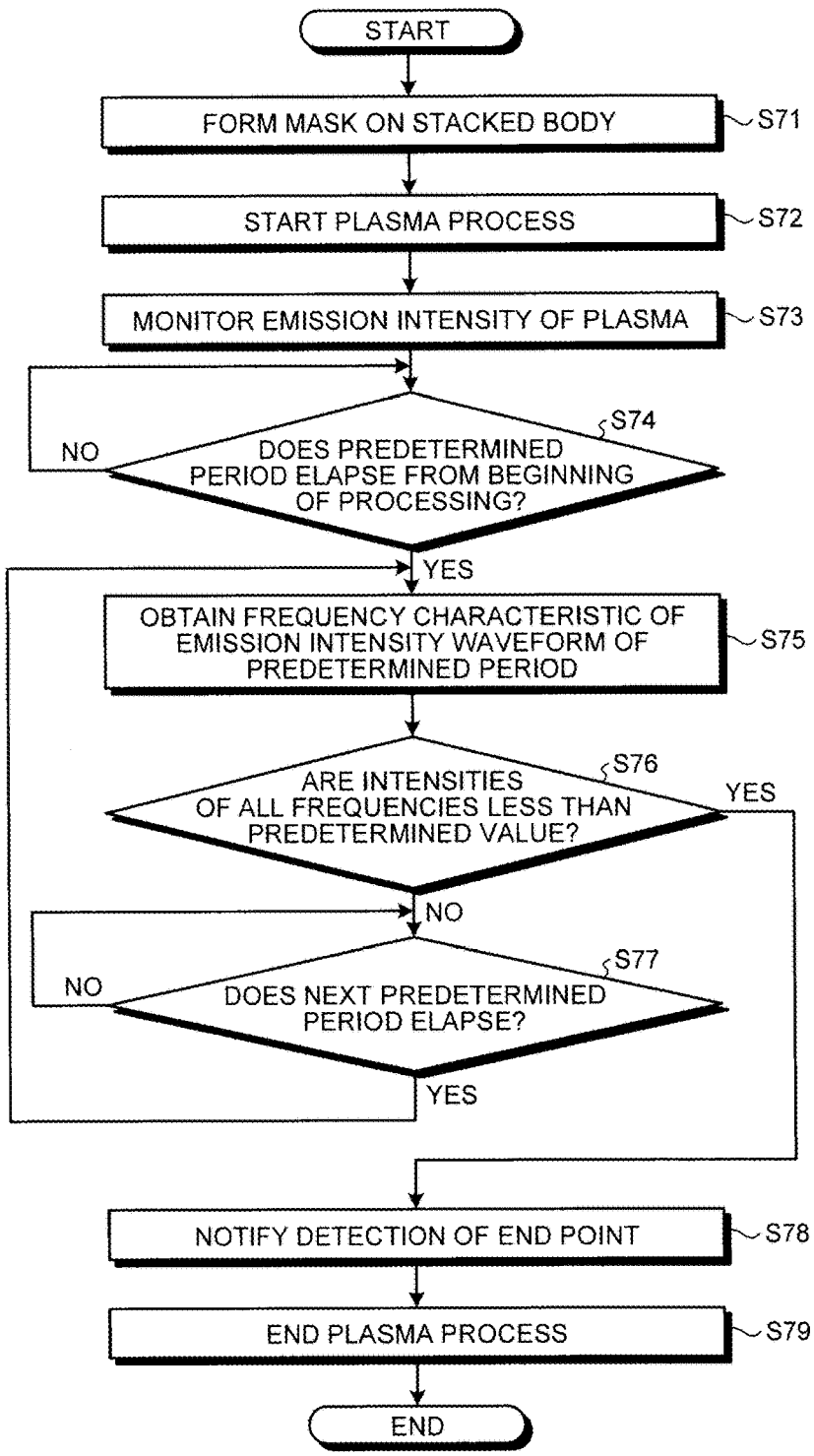

SEMICONDUCTOR MANUFACTURING APPARATUS AND METHOD OF MANUFACTURING SEMICONDUCTOR DEVICE

CROSS-REFERENCE TO RELATED APPLICATIONS

This application is based upon and claims the benefit of priority from Japanese Patent Application No. 2015-028894, filed on Feb. 17, 2015; the entire contents of which are incorporated herein by reference.

FIELD

Embodiments described herein relate generally to a semiconductor manufacturing apparatus and a method of manufacturing a semiconductor device.

BACKGROUND

In a dry etching, an end point is generally determined when an emission intensity of a plasma at a certain time falls by a predetermined degree from the emission intensity. Herein, it is desirable that a reference emission intensity at a certain time is not changed.

In recent years, there is proposed a nonvolatile semiconductor memory device having a three-dimensional structure in which memory cells are disposed in a stacked structure. In such a structure of the nonvolatile semiconductor device having the three-dimensional structure, an etching process is performed on a stacked body in which a plurality of different types of films are alternately stacked. The emission intensity of the plasma is undulated when the stacked body is subjected to the etching. Therefore, when an end point detection method generally used in the dry etching is employed, a variation occurs in an end point detection time.

BRIEF DESCRIPTION OF THE DRAWINGS

FIG. 7 is a flowchart illustrating an example of a processing procedure of a semiconductor manufacturing method according to the first embodiment;

FIG. 9 is a flowchart illustrating an example of a procedure of a semiconductor manufacturing method according to a second embodiment;

FIGS. 14A to 14C are diagrams illustrating the temporal variation of the emission intensity of the plasma of FIG. 13 after the Fourier transformation;

FIG. 15 is a flowchart illustrating an example of a processing procedure of a semiconductor manufacturing method according to the third embodiment.

DETAILED DESCRIPTION

According to one embodiment, there is provided a semiconductor manufacturing apparatus which includes a manufacturing processor, a signal acquisition unit, a frequency characteristic acquisition unit, and an end-point acquisition unit. The manufacturing processor controls each process unit which performs processing of a stacked body which is formed above a substrate and includes a plurality of different types of films periodically stacked thereon. The signal acquisition unit acquires a first processing signal which shows a different behavior in the processing of the stacked body and after the processing of the stacked body. The frequency characteristic acquisition unit acquires a frequency characteristic of a noise caused by a periodic structure of the stacked body from the first processing signal during the processing of the stacked body. The end-point acquisition unit detects an end point of the processing using the acquired frequency characteristic. The manufacturing processor ends the processing when the end point is detected.

Figure 1:
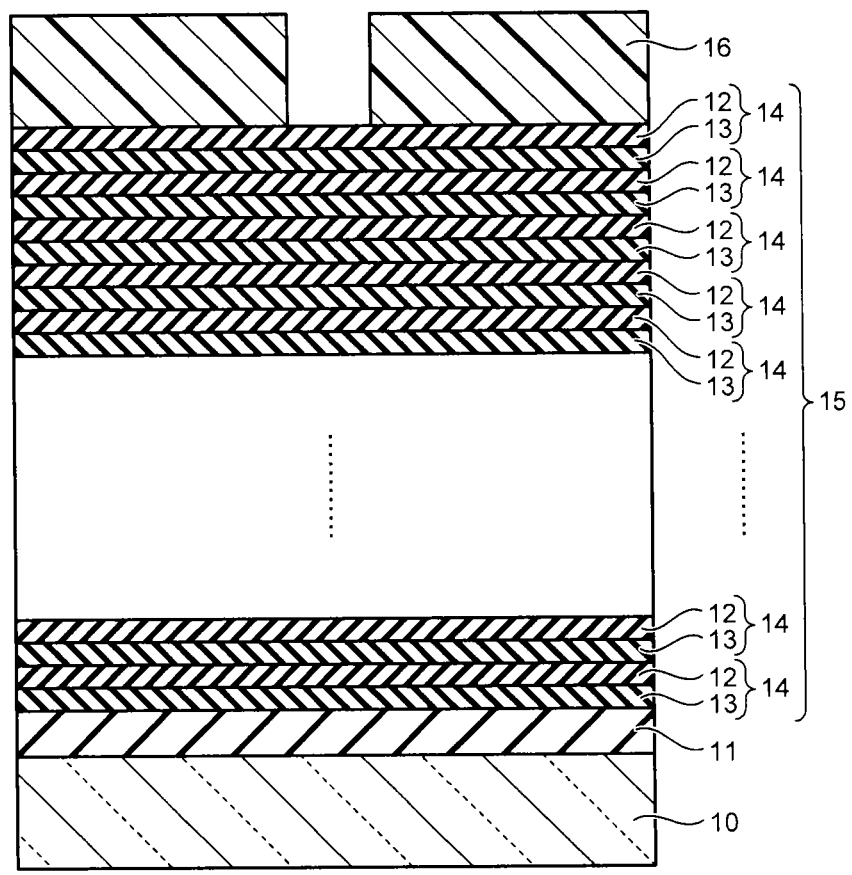
FIG. 1 is a cross-sectional view schematically illustrating an example of a stacked body of a processing target.

Hereinafter, a semiconductor manufacturing apparatus and a method of manufacturing a semiconductor device according to embodiments will be described in detail with reference to the accompanying drawings. Further, the invention is not limited to these embodiments. In addition, the following description will be made about an example where an etching process or a polishing process is performed on a stacked body in which a plurality of different types of films are alternately stacked. FIG. 1 is a cross-sectional view schematically illustrating an example of the stacked body of processing target. For example, a stacked body 15 is formed above a semiconductor substrate (wafer) 10, and heterogeneous first and second films 13 and 12 are alternately stacked in the stacked body 15 through an insulating film 11. As the stacked body 15 having the heterogenous films, a stacked body of a silicon nitride film and a silicon oxide film, a stacked body of a silicon film and the silicon oxide film, or the like may be exemplified. Each first film 13 has almost the same thickness (for example, a thickness of several tens nm). Each second film 12 has almost the same thickness (for example, a thickness of several tens nm). In addition, a set of one first film 13 and one second film 12 adjacent in a film thickness direction will be referred to as a pair layer 14 in the following. In addition, the lower pair layers 14 are counted from the uppermost pair layer 14 which is set as a first layer. In a case where the number of pair layers 14 is N, the pair layer 14 in a k-th order from the uppermost layer is denoted as a k-th pair layer. However, N is an integer of 2 or more, and k is an integer of 1 or more and N or less. In FIG. 1, a mask 16 is formed to pattern the stacked body 15 on the stacked body 15.

First Embodiment

Figure 2:
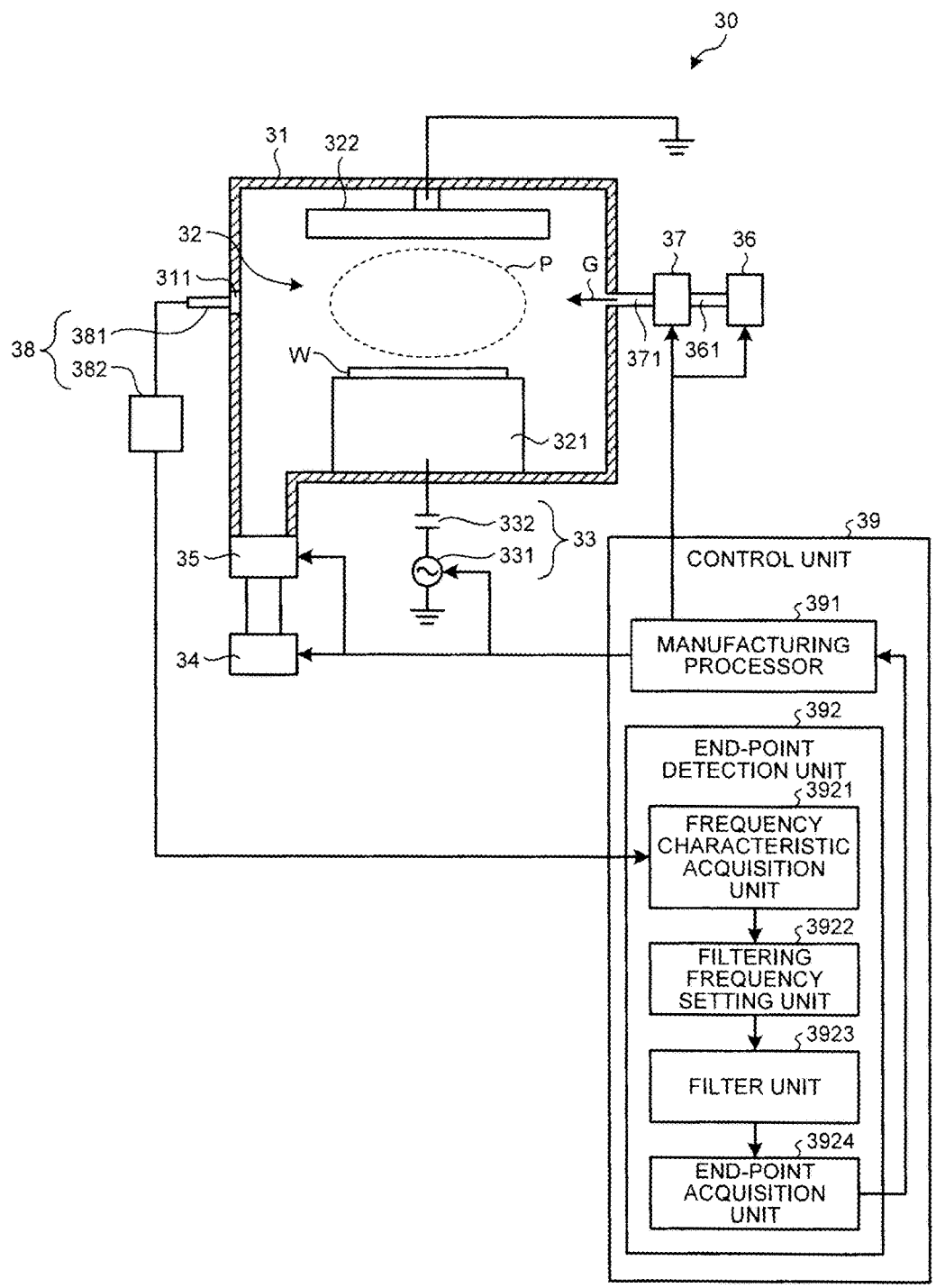
FIG. 2 is a diagram schematically illustrating an example of a configuration of a semiconductor manufacturing apparatus according to a first embodiment.

FIG. 2 is a diagram schematically illustrating an example of a configuration of a semiconductor manufacturing apparatus according to a first embodiment. Further, in FIG. 2, a RIE (Reactive Ion Etching) apparatus of a parallel plate electrode type is exemplified as the semiconductor manufacturing apparatus. The RIE apparatus 30 includes a chamber 31, a plasma generator 32, a power source unit 33, a decompression unit 34, a pressure control unit 35, a gas supply unit 36, a flow control unit 37, an emission intensity measuring unit 38, and a control unit 39.

The chamber 31 is formed in a substantially cylindrical shape of which the both ends are closed, and has an airtight structure capable of keeping a decompression atmosphere. The plasma generator 32 which generates a plasma P is provided in the chamber 31. In the upper portion of the side wall of the chamber 31, a window 311 is provided. The window 311 is made of a transparent material such as quartz and allows light to be transmitted therethrough. Further, a position of the window 311 is not limited to the upper portion of the side wall of the chamber 31, and can be appropriately changed.

The plasma generator 32 includes a lower electrode 321 and an upper electrode 322. The lower electrode 321 is provided below an area where the plasma P is generated in the chamber 31. In the lower electrode 321, a holding portion (not illustrated) is provided to hold the substrate W which is a processing object. As the holding portion (not illustrated), for example, an electrostatic chuck may be used. Therefore, the lower electrode 321 also serves as a disposing portion where the substrate W is disposed and held on the upper surface (a disposing surface). The upper electrode 322 is provided to face the lower electrode 321.

A power source 331 is connected to the lower electrode 321 through a blocking capacitor 332. In addition, the upper electrode 322 is earthed. The plasma generator 32 can generate the plasma P by supplying electromagnetic energy to the area where the plasma P is generated.

The power source unit 33 includes the power source 331 and the blocking capacitor 332. The power source 331 applies a radio-frequency power of about 100 KHz to 100 MHz to the lower electrode 321. The blocking capacitor 332 is provided to prevent electrons that generate in the plasma P and reach the lower electrode 321 from moving.

The decompression unit 34 is connected to the bottom of the chamber 31 through the pressure control unit 35. The decompression unit 34 decompresses the inside of the chamber 31 down to a predetermined pressure. As the decompression unit 34, for example, a turbo molecular pump may be used. The pressure control unit 35 controls an internal pressure of the chamber 31 to be the predetermined pressure based on an output of a vacuum gauge (not illustrated) which detects an internal pressure of the chamber 31. In other words, the chamber 31 has the area where the plasma P is generated therein, and can keep an atmosphere decompressed lower than the atmospheric pressure.

The gas supply unit 36 supplies an etching gas G to the area where the plasma P is generated. The flow control unit 37 performs control on the flow of the etching gas G supplied from the gas supply unit 36. The flow control unit 37 adjusts a supply amount of the etching gas G according to an instruction from the control unit 39. In the example illustrated in the drawing, the flow control unit 37 is provided in the upper portion of the side wall of the chamber 31 through a pipe 371. Then, the gas supply unit 36 is connected to the flow control unit 37 through a pipe 361.

The emission intensity measuring unit 38 measures an emission intensity of the plasma P having a predetermined wavelength generated in the etching process. The emission intensity measuring unit 38 includes a light receiving unit 381 and a spectrum analyzing unit 382.

The light receiving unit 381 is provided to face the window 311. In addition, the light receiving unit 381 and the spectrum analyzing unit 382 are optically connected to each other through an optical cable or the like. Therefore, the light incident on the light receiving unit 381 through the window 311 can be transmitted to the spectrum analyzing unit 382.

The spectrum analyzing unit 382 performs spectrum analysis on the light generated when a plasma process is performed. In other words, the spectrum analyzing unit 382 analyzes the light transmitted from the light receiving unit 381 (the light generated in the chamber 31) using optical emission spectroscopy (OES). In addition, the emission intensity with respect to the predetermined wavelength obtained by the OES is sequentially converted into an electric signal which is supplied to the control unit 39. The electric signal of the emission intensity corresponds to a first processing signal.

Figure 3:
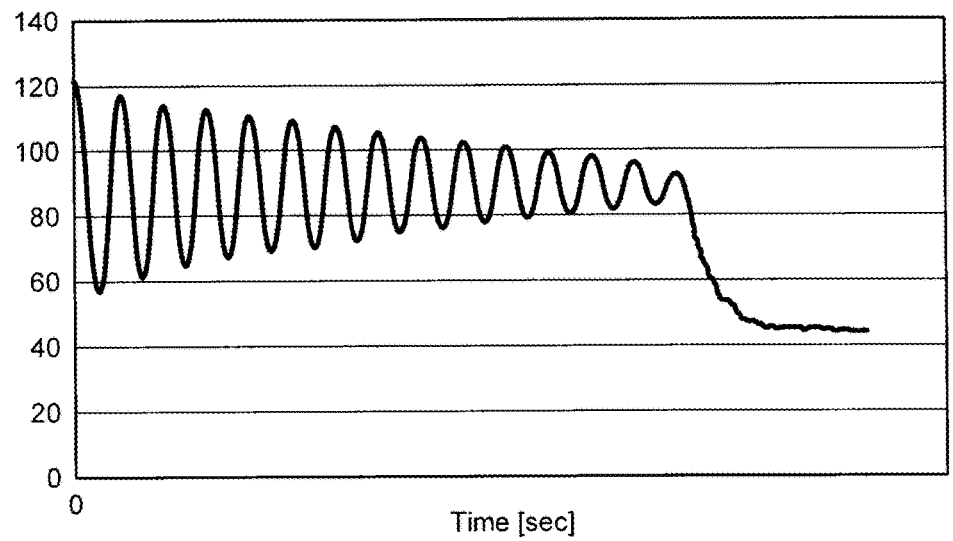
FIG. 3 is a diagram illustrating an example of a temporal variation of an emission intensity of a plasma obtained by an emission intensity measuring unit.

FIG. 3 is a diagram illustrating an example of a temporal variation of the emission intensity of the plasma obtained by the emission intensity measuring unit. In this drawing, the horizontal axis represents a processing time, and the vertical axis represents the emission intensity of the plasma having a predetermined wavelength. In general, the emission intensity of the plasma is constant, but noises generated when each pair layer 14 of the stacked body 15 is etched are periodically generated, so that the emission intensity is periodically changed as illustrated in the drawing. In addition, the amplitude becomes smaller as time goes by. One period (for example, a period from a certain peak to the next peak) shows that one of the pair layers 14 (the second film 12 and the first film 13) is etched.

The control unit 39 includes a manufacturing processor 391 and an end-point detection unit 392. The control unit 39 is implemented in software. For example, the manufacturing processor 391 controls the decompression unit 34, the gas supply unit 36, the power source 331, the pressure control unit 35, and the flow control unit 37 based on a predetermined recipe so as to perform the plasma process. In the manufacturing processor 391, when the end point is notified from the end-point detection unit 392, the plasma process is ended.

The end-point detection unit 392 performs a predetermined process on the electric signal (hereinafter, referred to as an emission intensity waveform) obtained from the spectrum analyzing unit 382 so as to detect the end point. The end-point detection unit 392 includes a frequency characteristic acquisition unit 3921, a filtering frequency setting unit 3922, a filter unit 3923, and an end-point acquisition unit 3924.

The frequency characteristic acquisition unit 3921 obtains a frequency characteristic of the emission intensity from the emission intensity waveform acquired from the spectrum analyzing unit 382. Therefore, the frequency of the periodic noise contained in the emission intensity waveform is obtained. Herein, the frequency is obtained after a plurality of pair layers 14 are etched. The frequency may be calculated by the Fourier transformation, or may be obtained directly from the emission intensity waveform.

Figure 4:
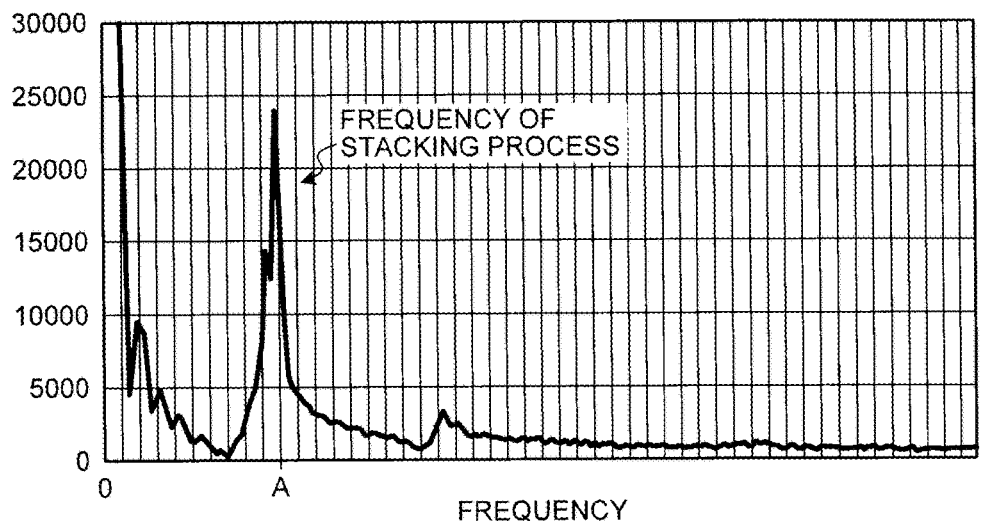
FIG. 4 is a diagram illustrating an example of a frequency characteristic of an emission intensity waveform.

FIG. 4 is a diagram illustrating an example of the frequency characteristic of the emission intensity waveform. FIG. 4 illustrates the frequency characteristic of the emission intensity waveform of FIG. 3. In this drawing, the horizontal axis represents the frequency, and the vertical axis represents the intensity. Herein, a large peak in the vicinity of a frequency A [Hz] is found, and the peak is the noise generated when the stacked body 15 is processed (that is, the noise causing periodical oscillation in FIG. 4).

The filtering frequency setting unit 3922 determines a frequency which is filtered based on the frequency characteristic acquired by the frequency characteristic acquisition unit 3921. For example, in a case where there are frequencies having a predetermined intensity or more, a frequency in a predetermined range about each of the frequencies having the predetermined intensity or more is set as a filtering frequency. In addition, for example, the frequency characteristic may be displayed in a display (not illustrated), and a frequency range selected by a user through an input unit (not illustrated) may be set as the filtering frequency.

Figure 5:
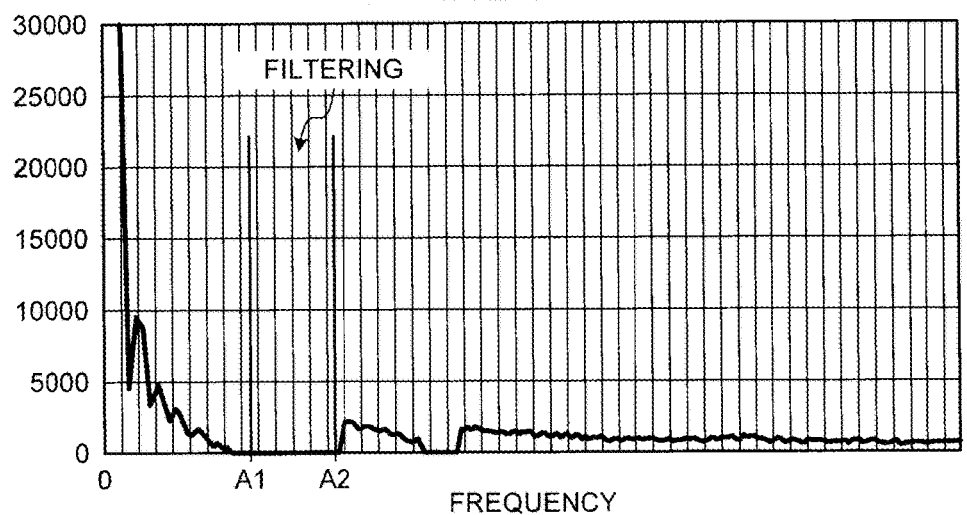
FIG. 5 is a diagram illustrating an example of the frequency characteristic after filtering.

FIG. 5 is a diagram illustrating an example of the frequency characteristic after the filtering. FIG. 5 illustrates the frequency characteristic in which the component of the set filtering frequency is removed from the frequency characteristic of FIG. 4 by a digital filter.

The filter unit 3923 removes the component of the set filtering frequency from the emission intensity waveform, and generates a denoised emission intensity waveform corresponding to a second processing signal. The filter unit 3923, for example, is a digital filter which removes the component of the filtering frequency set by the filtering frequency setting unit 3922 from the emission intensity waveform.

Figure 6:
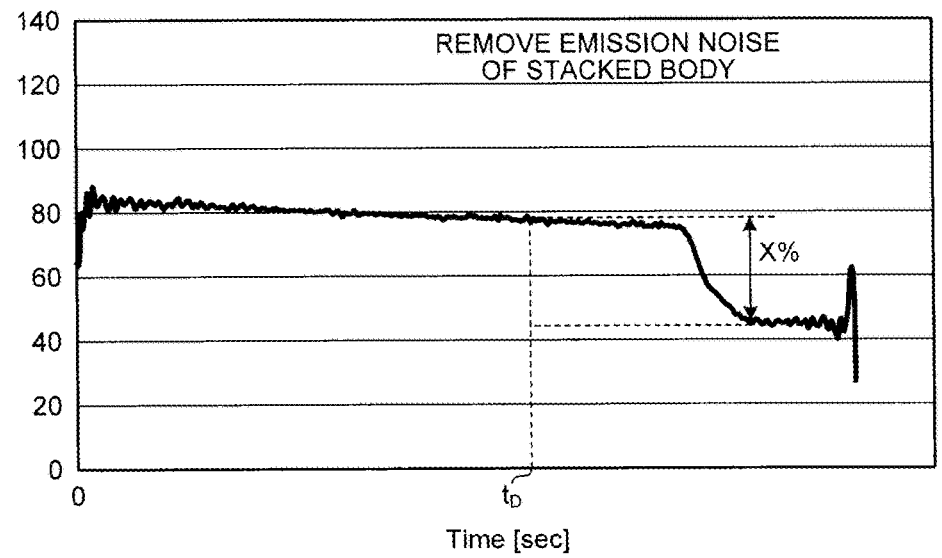
FIG. 6 is a diagram illustrating an example of a denoised emission intensity waveform.

FIG. 6 is a diagram illustrating an example of the denoised emission intensity waveform. In this drawing, the horizontal axis represents the processing time, and the vertical axis represents the emission intensity of the plasma having a predetermined wavelength. As illustrated in the drawing, the oscillating noises illustrated in FIG. 4 are removed, and the emission intensity becomes almost a constant value. Further, the denoised emission intensity waveform, for example, can be obtained from the filtered frequency characteristic illustrated in FIG. 5 by the reverse Fourier transformation.

The end-point acquisition unit 3924 obtains the end point from the denoised emission intensity waveform generated by the filter unit 3923. A method of acquiring the end point can be performed by a conventional method. For example, the emission intensity of time $t_D$ called "Delay Time" is assumed as a reference emission intensity. Then, the end point is defined as a time point when the emission intensity falls by a predetermined degree of X % compared to the reference emission intensity. The end-point acquisition unit 3924 sends a signal indicating that the end point is detected toward the manufacturing processor 391.

Next, a semiconductor manufacturing method performed in the semiconductor manufacturing apparatus of such a configuration will be described. FIG. 7 is a flowchart illustrating an example of a processing procedure of the semiconductor manufacturing method according to the first embodiment. First, for example, the stacked body 15 is formed in which a plurality of types of insulating films are alternately stacked above the semiconductor substrate (wafer) 10 as illustrated in FIG. 1, and the mask 16 is formed on the stacked body 15 (step S11). For example, the mask 16 is formed such that a resist film is coated on the stacked body 15 and patterned in a desired shape by lithography and development. Alternatively, the mask 16 may be formed by disposing a hard mask on the stacked body 15 and transferring a resist pattern onto the hard mask.

Next, the semiconductor substrate 10 is carried in the chamber 31 of the RIE apparatus 30 illustrated in FIG. 2, and disposed on the lower electrode 321. At this time, the semiconductor substrate 10, for example, is fixed by a mechanism such as the electrostatic chuck. Thereafter, the decompression unit 34 and the pressure control unit 35 are controlled by the manufacturing processor 391 such that the pressure in the chamber 31 becomes a predetermined pressure.

When the state in the chamber 31 becomes a predetermined state (for example, the predetermined pressure), the manufacturing processor 391 starts the plasma process on the stacked body 15 disposed above the semiconductor substrate 10 (step S12). At this time, the decompression unit 34, the pressure control unit 35, the gas supply unit 36, and the flow control unit 37 are controlled by the manufacturing processor 391 such that the pressure of the etching gas in the chamber 31 becomes a predetermined value. In addition, the radio-frequency power is applied to the lower electrode 321 from the power source 331 through the blocking capacitor 332, and the plasma P is generated between the lower electrode 321 and the upper electrode 322. Then, the etching is performed using the etching gas in a plasma state.

During the plasma process, the emission intensity measuring unit 38 monitors the intensity of the plasma having a predetermined wavelength through the window 311 provided in the chamber 31 (step S13). The emission intensity measuring unit 38 sends the emission intensity waveform to the frequency characteristic acquisition unit 3921. Further, the monitoring of the emission intensity of the plasma is continuously performed until the plasma process is ended.

Next, when a predetermined number of pair layers 14 are etched after the beginning of processing, the frequency characteristic acquisition unit 3921 obtains the frequency characteristic of the emission intensity waveform (step S14). Therefore, for example, the frequency characteristic of the emission intensity waveform as illustrated in FIG. 4 is obtained.

Thereafter, the filtering frequency setting unit 3922 selects the filtering frequency from the frequency characteristic of the obtained emission intensity waveform (step S15). In the example of FIG. 4, the frequencies in a range from A1 [Hz] to A2 [Hz] are filtered in order to remove the peak in the vicinity of A [Hz]. Therefore, the frequency characteristic after the digital filter illustrated in FIG. 5 is obtained.

Next, the filter unit 3923 generates the denoised emission intensity waveform obtained by removing the component of the filtering frequency from the obtained emission intensity waveform using the digital filter (step S16). For example, the oscillating noise illustrated in FIG. 3 is removed, and the denoised emission intensity waveform illustrated in FIG. 6 in which the emission intensity is almost a constant value is generated.

Thereafter, the end-point acquisition unit 3924 acquires the emission intensity at time $t_D$ in the denoised emission intensity waveform, and sets the emission intensity as the reference emission intensity (step S17). Next, the filter unit 3923 removes the component of the filtering frequency from the emission intensity waveform continuously sent from the spectrum analyzing unit 382 using the digital filter (step S18).

Thereafter, the end-point acquisition unit 3924 determines whether the emission intensity observed at the present time in the denoised emission intensity waveform is decreased by a predetermined degree or more from the reference emission intensity (step S19). In a case where the current emission intensity is not decreased by the predetermined degree from the reference emission intensity (No in step S19), the etching is not ended yet, so that the procedure returns to step S18 and the monitoring goes on.

In addition, in a case where the current emission intensity is decreased by the predetermined degree or more from the reference emission intensity (Yes in step S19), the etching is considered to be ended, and the detection of the end point is notified to the manufacturing processor 391 (step S20).

When the notification of the detection of the end point is received, the manufacturing processor 391 ends the plasma process (step S21). Herein, the control is made such that the supplying of the radio-frequency power from the power source 331 to the lower electrode 321 is stopped, and the supplying of the gas from the gas supply unit 36 into the chamber 31 is stopped. Then, the semiconductor substrate 10 is carried out of the lower electrode 321, and the process is ended. Thereafter, a process of manufacturing a predetermined semiconductor device is performed using the etched stacked body 15.

Figure 8A:
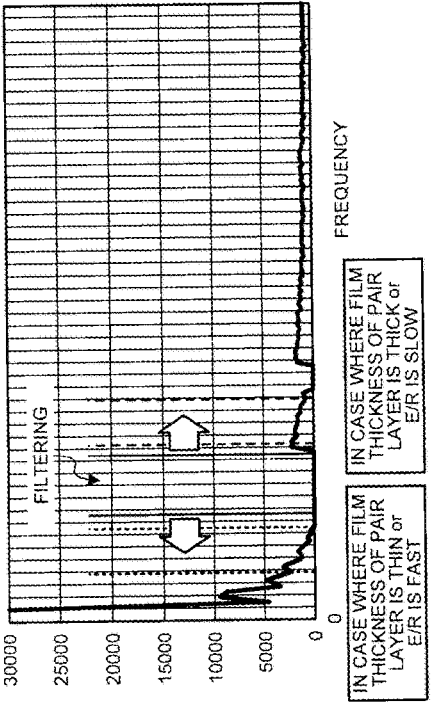
FIGS. 8A to 8D are diagrams illustrating an outline of a filtering process in a case where there is a variation of a film thickness or an etching rate of a substrate.
Figure 8C:
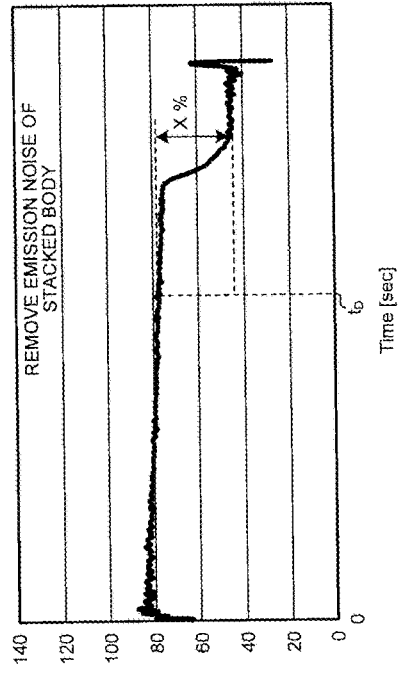
Figure 8B:
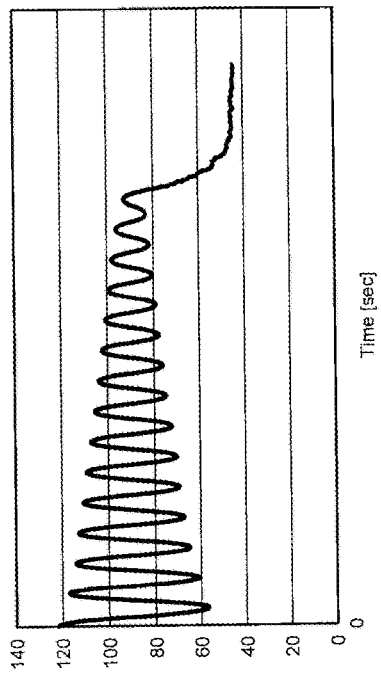
Figure 8D:
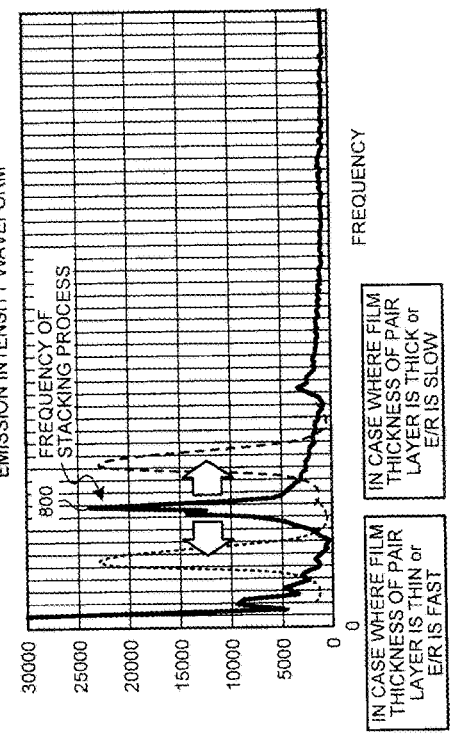

Further, the above-mentioned process is desirably performed whenever the substrate is processed. FIGS. 8A to 8D are diagrams illustrating an outline of a filtering process in a case where there is a variation of a film thickness or an etching rate of a substrate. FIG. 8A illustrates the emission intensity waveform, FIG. 8B illustrates the frequency characteristic of the emission intensity waveform, FIG. 8C illustrates the frequency characteristic of the emission intensity waveform which is subjected to the filtering by the digital filter, and FIG. 8D illustrates the denoised emission intensity waveform.

The solid lines in FIGS. 8A to 8D indicate the emission intensity waveform or the frequency characteristic in the stacked body 15 of a certain semiconductor substrate 10. The semiconductor substrate 10 is set as a reference substrate. In a case where a substrate has a film thickness of the pair layer 14 thinner than that of the reference substrate or has an etching rate faster than that of the reference substrate, the frequency of the noise becomes smaller than the case of the reference substrate. Therefore, as illustrated in FIG. 8B, a noise 800 is shifted to the left side (that is, a smaller frequency) from the peak of the reference substrate. As a result, as illustrated in FIG. 8C, the filtering frequency is also shifted to be a smaller frequency. Then, as illustrated in FIG. 8D, the noise of the semiconductor substrate 10 can be removed by removing the component of the filtering frequency using the digital filter.

On the other hand, in a case where a substrate includes the pair layer 14 having a film thickness larger than that of the reference substrate or has the etching rate slower than that of the reference substrate, the frequency of the noise becomes larger than the case of the reference substrate. Therefore, as illustrated in FIG. 8B, the noise 800 is shifted to the right side (that is, a larger frequency) from the peak of the reference substrate. As a result, as illustrated in FIG. 8C, the filtering frequency is also shifted to be a larger frequency. Then, as illustrated in FIG. 8D, the noise of the substrate can be removed by removing the component of the filtering frequency using the digital filter.

In this way, the film thickness or the etching rate may be different depending on the semiconductor substrate 10, but when the method of this embodiment is employed for the etching of each semiconductor substrate 10, it is possible to adjust the difference of the film thickness or the etching rate of each semiconductor substrate 10.

In the first embodiment, when a predetermined number of pair layers 14 are processed after the beginning of the processing, the frequency of the noise is obtained, and the component of the frequency is removed from the emission intensity waveform using the digital filter. Therefore, the emission intensity of the plasma becomes substantially constant, so that it is possible to employ an end point detection method in which the end point is detected in a case where the emission intensity is decreased by the predetermined degree or more from the reference intensity. As a result, it is possible to detect the end point of the etching process accurately.

In addition, since the filtering frequency is obtained from the emission intensity waveform whenever the semiconductor substrate 10 is processed and the end point is detected, it is possible to effectively cope with a case where the film thickness varies in each semiconductor substrate 10 or a case where the etching rate is changed.

Second Embodiment

In the first embodiment, the description has been made on an assumption that there is no variation of the film thickness or the etching rate is not changed in one substrate. Therefore, when a predetermined number of pair layers are completely processed after the beginning of the processing, the filtering frequency is obtained, and the subsequent filtering of the emission intensity waveform is performed at the filtering frequency. However, in a case where a variation occurs in the film thickness or a case where the etching rate is changed in one substrate, it is not possible to clearly remove the noise. Then, the description in a second embodiment will be made about that the end point in the semiconductor manufacturing process is detected in a case where the variation occurs in the film thickness or in a case where the etching rate is changed in one substrate.

The configuration of a semiconductor manufacturing apparatus according to the second embodiment is different in the function of the filtering frequency setting unit 3922 of the first embodiment. The filtering frequency setting unit 3922 sets the filtering frequency plural times during an etching process (a period until the processing is ended in the stacked body 15 after the beginning of the processing). For example, when the processing proceeds up to an a-th pair layer after the beginning of the processing, a first setting process of the filtering frequency is performed. Next, when the processing proceeds from a (a+1)-th pair layer up to a b-th pair layer, a second setting process of the filtering frequency is performed. Thereafter, similarly, an N-th setting (N is an integer of 3 or more, and a and b are integers of 2 or more and N or less, satisfying a<b) of the filtering frequency is finally performed.

In addition, the filtering frequency setting unit 3922 determines whether the filtering frequency thus set is equal to the currently-used filtering frequency. In a case where both filtering frequencies are equal to each other, the currently-used filtering frequency is used, and otherwise the newly-set filtering frequency is used for the emission intensity waveform which is monitored later on. Further, the other components are identical with or similar to those of the first embodiment, and thus the descriptions thereof are not repeated.

Next, the semiconductor manufacturing method using the semiconductor manufacturing apparatus according to the second embodiment will be described. FIG. 9 is a flowchart illustrating an example of a procedure of a semiconductor manufacturing method according to the second embodiment.

Similarly to steps S11 to S13 of FIG. 7 of the first embodiment, the semiconductor substrate 10 in which the mask 16 is formed on the stacked body 15 is fixed onto the lower electrode 321 of the semiconductor manufacturing apparatus, a predetermined pressure is set in the chamber 31, and the etching gas is introduced therein. Thereafter, a plasma is generated and the plasma process starts, and then the emission intensity of the plasma is monitored (steps S31 to S33).

Next, the frequency characteristic acquisition unit 3921 acquires a first frequency characteristic from a first emission intensity waveform in a first frequency calculating period after the beginning of the processing (step S34). The first frequency calculating period, for example, is a period where the etching is performed on the a-th pair layer after the beginning of the processing. Thereafter, the filtering frequency setting unit 3922 selects a first filtering frequency from the first frequency characteristic of the first emission intensity waveform (step S35).

Thereafter, the filter unit 3923 generates a first denoised emission intensity waveform obtained by removing the component of the first filtering frequency from the first emission intensity waveform using the digital filter (step S36).

Figure 10:
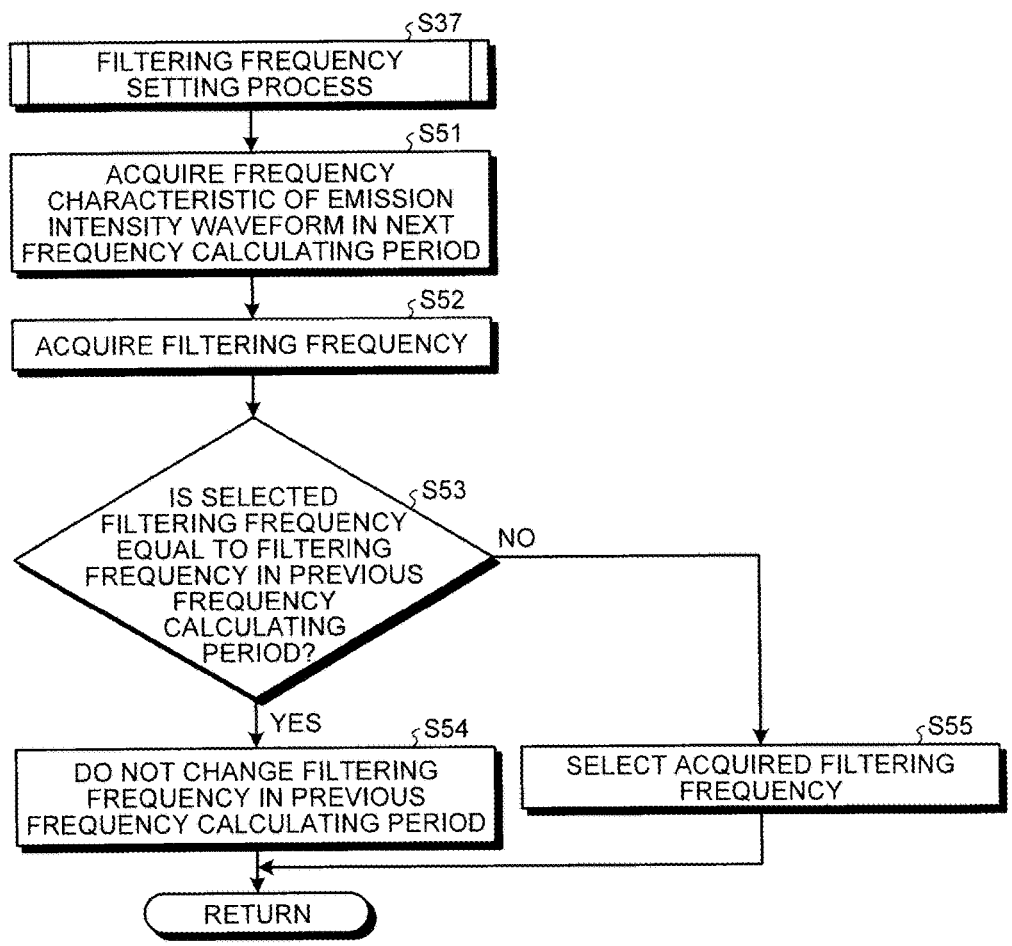
FIG. 10 is a flowchart illustrating an example of a procedure of a filtering frequency setting process.

Thereafter, a setting process of the filtering frequency in the next frequency calculating period is performed (step S37). FIG. 10 is a flowchart illustrating an example of a procedure of a filtering frequency setting process. First, the frequency characteristic of the emission intensity waveform is obtained in the next frequency calculating period (step S51). Next, the filtering frequency setting unit 3922 acquires the filtering frequency from the frequency characteristic of the obtained emission intensity waveform (step S52). In addition, the filtering frequency setting unit 3922 determines whether the acquired filtering frequency is equal to the filtering frequency in the previous frequency calculating period (step S53).

Further, the acquired filtering frequency and the filtering frequency in the previous frequency calculating period may be completely matched with each other, and in a case where the filtering frequency in the previous frequency calculating period and the acquired filtering frequency are present in a predetermined range, both filtering frequencies may be considered as the matched frequency.

In a case where the filtering frequency is equal to the filtering frequency of the previous frequency calculating period (Yes in step S53), the filtering frequency setting unit 3922 does not change the filtering frequency of the previous frequency calculating period (step S54). In addition, in a case where the filtering frequency is different from the filtering frequency of the previous frequency calculating period (No in step S54), the filtering frequency setting unit 3922 selects the acquired filtering frequency (step S55). Then, the filtering frequency setting process is ended, and the process returns to FIG. 9.

Returning to FIG. 9, thereafter, the filter unit 3923 removes the component of the filtering frequency selected from the emission intensity waveform acquired after the next frequency calculating period using the digital filter (step S38). Further, in steps S37 to S38 performed after the first frequency calculating period, the next frequency calculating period becomes a second frequency calculating period, and the acquired filtering frequency becomes a second filtering frequency.

Thereafter, the filtering frequency setting unit 3922 determines whether there is a next frequency calculating period (step S39). In a case where there is a next frequency calculating period (Yes in step S39), the procedure returns to step S37. In addition, in a case where there is no next frequency calculating period (No in step S39), the intensity of the denoised emission intensity waveform at a certain time is set as the reference emission intensity (step S40).

Next, the filter unit 3923 removes the component of the filtering frequency from the emission intensity waveform continuously sent from the spectrum analyzing unit 382 using the digital filter (step S41). Thereafter, the end-point acquisition unit 3924 determines whether the emission intensity observed at the present time in the denoised emission intensity waveform is decreased by a predetermined degree or more from the reference emission intensity (step S42). In a case where the current emission intensity is not decreased by the predetermined degree or more from the reference emission intensity (No in step S42), the etching is not ended yet, so that the procedure returns to step S41 and the monitoring goes on.

In addition, in a case where the current emission intensity is decreased by the predetermined degree or more from the reference emission intensity (Yes in step S42), the etching is assumed to be ended, and the detection of the end point is notified to the manufacturing processor 391 (step S43). Similarly to step S21 of FIG. 7 of the first embodiment, when the notification of the detection of the end point is received, the manufacturing processor 391 ends the plasma process (step S44). Then, the process is ended. Thereafter, a process of manufacturing a predetermined semiconductor device is performed using the etched stacked body 15.

Figure 11:
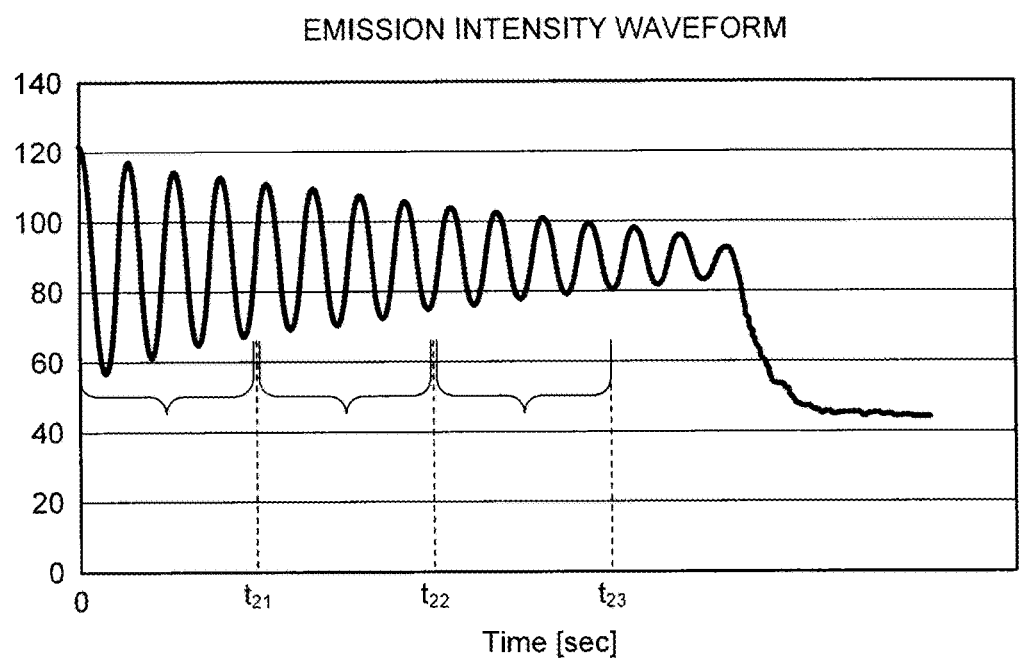
FIG. 11 is a diagram illustrating an example of an outline of the filtering frequency setting process according to the second embodiment.

FIG. 11 is a diagram illustrating an example of an outline of the filtering frequency setting process according to the second embodiment. In this drawing, the monitored emission intensity waveform is illustrated. In this drawing, the horizontal axis represents time elapsing after the beginning of the processing, and the vertical axis represents the emission intensity of the plasma. As illustrated in this drawing, a period from time 0 (the beginning of the processing) to time $t_{21}$ is the first frequency calculating period, a period from time $t_{21}$ to time $t_{22}$ is the second frequency calculating period, and a period from time $t_{22}$ to time $t_{23}$ is a third frequency calculating period. In other words, the filtering frequency setting process is performed three times. For example, in a case where the first to third filtering frequencies calculated in the first to third frequency calculating periods are different from each other, the first to third filtering frequencies are set in the first to third frequency calculating periods, respectively. In addition, in a case where the first and second filtering frequencies are equal and the third filtering frequency is different, the first filtering frequency is set in the first and second frequency calculating periods, and the third filtering frequency is set in the third frequency calculating period.

Further, the description has been made about that the reference emission intensity is obtained after it is determined that there is no next frequency calculating period of step S39, but the reference emission intensity may be obtained at any timing as long as the first denoised emission intensity waveform is obtained by removing the noise at the first filtering frequency of step S36 and it is not determined yet whether the end point is detected in step S42.

In the second embodiment, a plurality of frequency calculating periods are provided, and the filtering frequency of the monitored emission intensity is obtained at each frequency calculating period. In addition, it is determined whether the obtained filtering frequency is equal to the previous frequency calculating period. In a case where both filtering frequencies are equal to each other, the filtering frequency of the previous frequency calculating period is used, and otherwise the obtained filtering frequency is set. Therefore, in one semiconductor substrate 10, even in a case where there is a variation of the film thickness in the stacked film or in a case where the etching rate varies due to the etching gas, it is possible to remove the periodic noise from the original waveform of the emission intensity with a high accuracy. As a result, the same effect as that of the first embodiment can be obtained.

Third Embodiment

In the first and second embodiments, the frequency characteristic of the monitored emission intensity is acquired, the filtering frequency is obtained from the frequency characteristic, and the end point is detected using the emission intensity waveform from which the noise is removed. In a third embodiment, the description will be made about a case where the end point is detected by another method.

Figure 12:
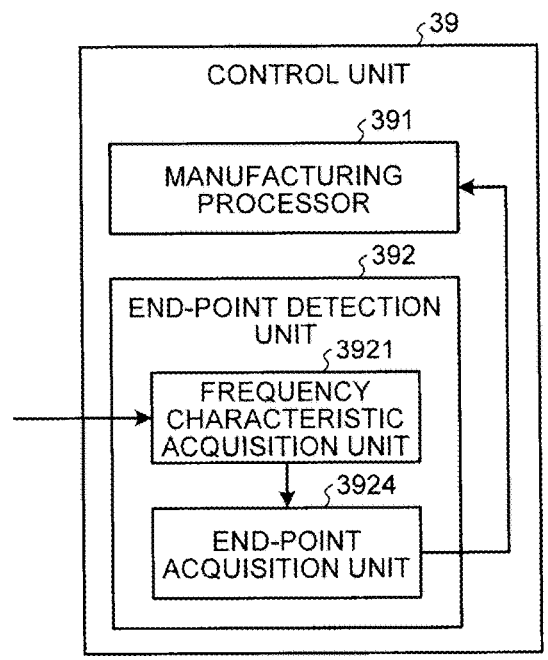
FIG. 12 is a block diagram schematically illustrating an example of a functional configuration of a control unit of a semiconductor manufacturing apparatus according to a third embodiment.

FIG. 12 is a block diagram schematically illustrating an example of a functional configuration of the control unit of a semiconductor manufacturing apparatus according to the third embodiment. Further, the configuration of the semiconductor manufacturing apparatus other than the control unit 39 are the same as those illustrated in FIG. 2, and thus the description thereof will not be repeated.

The control unit 39 of the semiconductor manufacturing apparatus according to the third embodiment includes the manufacturing processor 391 and the end-point detection unit 392. The control unit 39 is implemented in software. The manufacturing processor 391 is the same as that described in the first embodiment. The end-point detection unit 392 includes the frequency characteristic acquisition unit 3921 and the end-point acquisition unit 3924.

The frequency characteristic acquisition unit 3921 calculates a frequency of the noise from an emission intensity signal acquired from the spectrum analyzing unit 382 for each predetermined period through the Fourier transformation.

The end-point acquisition unit 3924 measures the frequency acquired by the frequency characteristic acquisition unit 3921 for each predetermined period, determines that the etching is ended in a case where no frequency in a certain period is output, and transfers the result to the manufacturing processor 391. In practice, it is rare for the frequency not to be output at all, so that a case where all the calculated frequencies are less than a predetermined intensity may be considered as a case where no frequency is output.

A principle of the end point detection in the etching according to the third embodiment will be described. As described above, in the etching process of the stacked body 15, when a periodic stacked structure is etched, the emission intensity periodically changes like a sinusoidal wave. However, when it goes to the film (the insulating film 11 in FIG. 1) below the stacked body 15 (that is, outside the stacked body 15), the frequency is not output. Then, in the third embodiment, a time point when the frequency is not output is considered as the end point of the etching.

Figure 13:
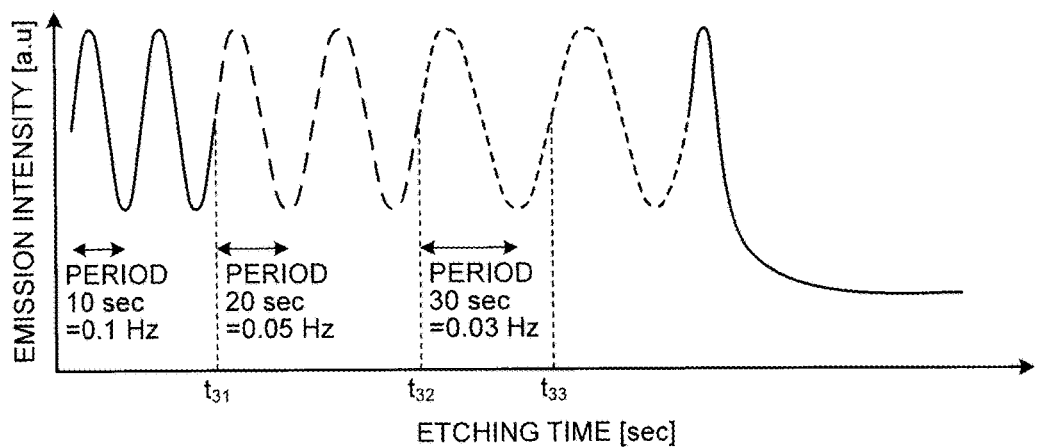
FIG. 13 is a diagram illustrating an example of a temporal variation of an emission intensity of a plasma according to the third embodiment.

FIG. 13 is a diagram illustrating an example of the temporal variation of the emission intensity of the plasma according to the third embodiment. FIGS. 14A to 14C are diagrams in which the temporal variation of the emission intensity of the plasma of FIG. 13 is subjected to the Fourier transformation, in which FIG. 14A is a diagram illustrating an example of a relation between the frequency and the time when the stacked film is etched, FIG. 14B is a diagram illustrating an example of a state where the stacked film is being etched, and FIG. 14C is a diagram illustrating an example of a state when the etching of the stacked film is ended.

When the stacked body 15 illustrated in FIG. 1 is etched, as illustrated in FIG. 13, a time (period) taken for the etching of one layer of the pair layer 14 becomes longer (the etching rate becomes larger) as it goes from a shallow area to a deep area. This means that the frequency of the noise superimposed on the emission intensity waveform becomes smaller as time goes by. For example, in the example of FIG. 13, the period is 10 seconds and the frequency is 0.1 Hz in a first period from the beginning of the processing to time $t_{31}$; the period is 20 seconds and the frequency becomes 0.05 Hz in a second period from time $t_{31}$ to time $t_{32}$; and the period is 30 seconds and the frequency becomes 0.03 Hz in a third period from time $t_{32}$ to $t_{33}$. Then, finally, the period approaches infinity, and the frequency becomes 0 Hz. This state is illustrated in FIG. 14A. In FIG. 14A, when there is no output frequency, it can be determined that the etching is ended.

In the third embodiment, the frequency characteristic acquisition unit 3921 performs the Fourier transformation on the emission intensity waveform for each predetermined period. The result of the Fourier transformation performed on the first to third periods of FIG. 13 is illustrated in FIG. 14B. As illustrated in the drawing, the frequency moves in a direction toward "0" as it goes from the first period to the third period. Thereafter, similarly the Fourier transformation of the emission intensity waveform is performed for each predetermined period, and no output is found as illustrated in FIG. 14C. The end-point acquisition unit 3924 determines that the end point is detected when the state of no output frequency is detected. Further, as described above, the frequency of some intensity is calculated in practice. However, when the intensity is less than a certain threshold $I_{th}$ having no influence on the end point detection, the corresponding frequency is neglected, so that the end point detection can be performed.

FIG. 15 is a flowchart illustrating an example of a processing procedure of a semiconductor manufacturing method according to the third embodiment. Similarly to steps S11 to S13 of FIG. 7 of the first embodiment, the semiconductor substrate 10 in which the mask 16 is formed on the stacked body 15 is fixed onto the lower electrode 321 of the semiconductor manufacturing apparatus, a predetermined pressure is set in the chamber 31, and the etching gas is introduced therein. Thereafter, a plasma is generated and the plasma process starts, and then the emission intensity of the plasma is monitored (step S71 to S73).

Next, the frequency characteristic acquisition unit 3921 determines whether a predetermined period elapses after the beginning of the processing (step S74). The predetermined period is desirably set to be larger than time taken for etching one layer of the pair layer 14. In a case where the predetermined period does not elapse (No in step S74), it enters a standby state. In addition, in a case where the predetermined period elapses (Yes in step S74), the frequency characteristic acquisition unit 3921 obtains the frequency characteristic of the emission intensity waveform of the predetermined period (step S75). For example, the frequency characteristic can be obtained by the Fourier transformation. The filter unit 3923 determines whether the intensities of all the frequencies are less than a predetermined value (step S76).

In a case where the intensities of all the frequencies are larger than the predetermined value (No in step S76), it is determined whether the next predetermined period elapses (step S77). In a case where the predetermined period does not elapse (No in step S77), it enters the standby state. In addition, in a case where the predetermined period elapses (Yes in step S77), the process returns to step S75.

In a case where it is determined in step S76 that the intensities of all the frequencies are less than the predetermined value (Yes in step S76), the filter unit 3923 considers that the etching is ended, and notifies the detection of the end point to the manufacturing processor 391 (step S78). When the notification of the detection of the end point is received, the manufacturing processor 391 ends the plasma process similarly to step S21 of FIG. 7 of the first embodiment (step S79). Then, the process is ended. Thereafter, a process of manufacturing the predetermined semiconductor device is performed using the etched stacked body 15.

In the third embodiment, the monitored emission intensity waveform is subjected to the Fourier transformation for each predetermined period, and it is determined whether the intensities of all the resultant frequencies are equal to or less than the predetermined value. Then, in a case where the intensities of all the frequencies are equal to or less than the predetermined value, the end point of the etching is detected and notified to the manufacturing processor 391, and then the plasma process is ended. Therefore, even in a case where the emission intensity is periodically changed, it is possible to accurately obtain the end point of the etching process.

Further, the above description has been made about an example where the parallel flat electrode type of the RIE apparatus is employed as the semiconductor manufacturing apparatus, and other types of the RIE apparatuses such as an ICP (Inductive Coupling Plasma) type of the RIE apparatus and a magnetron type of the RIE apparatus may be employed. In addition, a CDE (Chemical Dry Etching) apparatus may be employed as the semiconductor manufacturing apparatus. In a case where the CDE apparatus is employed, the configuration is the same as that of the above-mentioned RIE apparatus.

Figure 16:
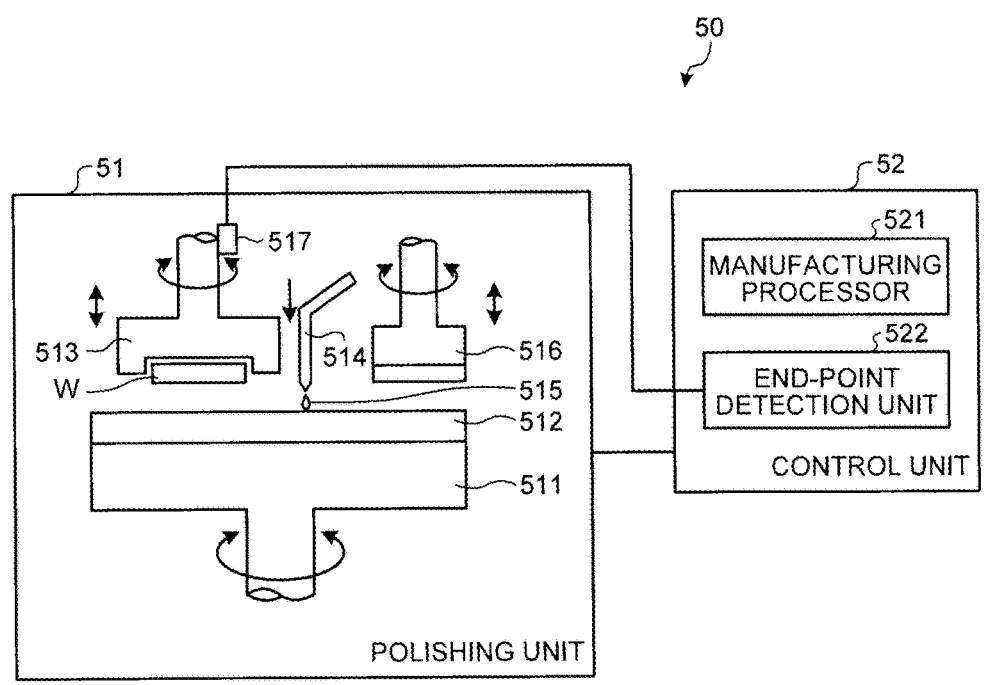
FIG. 16 is a diagram schematically illustrating an example where the semiconductor manufacturing apparatus according to the embodiment is applied to a CMP apparatus.

Furthermore, a CMP (Chemical Mechanical Polishing) apparatus may be employed as the semiconductor manufacturing apparatus. FIG. 16 is a diagram schematically illustrating an example where the semiconductor manufacturing apparatus according to an embodiment is applied to the CMP apparatus. The CMP apparatus 50 includes a polishing unit 51 which performs a polishing process of the substrate W and a control unit 52 which controls the process in the polishing unit 51.

The polishing unit 51 includes a polishing table 511 which is rotatable, a polishing pad 512 which is bonded on the polishing table 511 through an adhesive layer (not illustrated), a polishing head 513 which is disposed above the polishing pad 512 and holds the substrate W, a chemical solution supply nozzle 514 which supplies a chemical solution such as polishing slurry 515 at the time of polishing, a dresser 516 (for example, a diamond disk) which is disposed above the polishing pad 512 and dresses the polishing pad 512, and a torque value measuring unit 517 which measures a value of torque (a force making the polishing head 513 rotate), sequentially converts the torque value into an electric signal, and outputs the electric signal to the control unit. The electric signal (the first processing signal) indicating the torque value obtained by the torque value measuring unit 517 has the same waveform as that of the emission intensity of the plasma described above.

The control unit 52 includes a manufacturing processor 521 and an end-point detection unit 522. The control unit 52 is implemented in software. The manufacturing processor 521, for example, controls the respective processors of the polishing unit 51 according to a recipe generated in advance so as to perform a CMP process. When the notification of the end point from the end-point detection unit 522 is received, the manufacturing processor 521 ends the CMP process.

The end-point detection unit 522 performs a predetermined process on the electric signal corresponding to the torque value of the polishing head 513 acquired from the torque value measuring unit 517 according to the same procedure as the end-point detection unit 392 described in the first to third embodiments, and detects the end point. The end-point detection unit 392 described in any one of the first to third embodiments can be applied to the end-point detection unit 522.

In this way, even when the stacked body 15 in the CMP apparatus 50 is polished, it is possible to detect the end point as described above in the first to third embodiments.

In addition, the above description has been made about an example where two types of films are alternately stacked on the stacked body 15. However, the above embodiments are not limited to this configuration. For example, even in a case where three types of films are periodically stacked on the stacked body 15 in a predetermined order, the above-mentioned embodiments can be applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing apparatus comprising:
   a manufacturing processor configured to control each process unit which performs processing of a stacked body, the stacked body being formed by repeatedly stacking two or more types of films in predetermined order above a substrate, the processing being an etching process on the stacked body using a plasma;
   an emission intensity measuring unit configured to acquire a first processing signal, the first processing signal showing a different behavior during the processing of the stacked body and after the processing of the stacked body, the first processing signal being an emission intensity of the plasma having a predetermined wavelength;
   a frequency characteristic acquisition unit configured to acquire a frequency characteristic of a noise from the first processing signal by a Fourier transformation during the processing of the stacked body, the noise being caused by a periodic structure of the stacked body;
   a filtering frequency setting unit configured to set a filtering frequency from the frequency characteristic;
   a filter unit configured to generate a second processing signal by filtering a component of the filtering frequency from the first processing signal; and
   an end-point acquisition unit configured to detect an end point of the processing, the end point being a time point when a signal intensity is reduced by a predetermined degree from a reference signal intensity at a predetermined time of the second processing signal, wherein the frequency characteristic acquisition unit acquires the frequency characteristic of the noise, after a predetermined number of films are etched, and the manufacturing processor ends the processing when the end point is detected.

2. The semiconductor manufacturing apparatus according to claim 1, wherein the frequency characteristic acquisition unit acquires the frequency characteristic of the first processing signal, the first processing signal being acquired in a predetermined period after the beginning of the processing, and the filter unit performs filtering on the first processing signal to be acquired later by the emission intensity measuring signal acquisition unit using the frequency characteristic.

3. The semiconductor manufacturing apparatus according to claim 1, wherein the frequency characteristic acquisition unit acquires first to N-th frequency characteristics plural times in each of first to N-th frequency calculating periods (N is an integer of 2 or more), the frequency calculating periods being set after the beginning of the processing and before the end of the processing on the stacked body, the filtering frequency setting unit sets a k-th filtering frequency obtained from a k-th frequency characteristic to a k-th frequency calculating period (k is an integer of 1 or more and N or less), and the filter unit filters a component of the k-th filtering frequency from the first processing signal of the k-th frequency calculating period.

4. The semiconductor manufacturing apparatus according to claim 3, wherein in a case where the k-th filtering frequency is equal to a (k−1)-th filtering frequency, the filtering frequency setting unit sets the (k−1)-th filtering frequency and does not change the setting.

5. The semiconductor manufacturing apparatus according to claim 4, wherein in a case where a difference between the k-th filtering frequency and the (k−1)-th filtering frequency falls within a predetermined range, the filtering frequency setting unit determines that the k-th filtering frequency is equal to the (k−1)-th filtering frequency.

6. The semiconductor manufacturing apparatus according to claim 3, wherein in a case where the k-th filtering frequency is different from the (k−1)-th filtering frequency, the filtering frequency setting unit sets the k-th filtering frequency.

7. The semiconductor manufacturing apparatus according to claim 1, wherein in a predetermined period after the beginning of the processing, the frequency characteristic acquisition unit repeatedly performs a process of acquiring a frequency characteristic of the first processing signal in the predetermined period, and the end-point acquisition unit detects a time point as the end point of the processing when there is no frequency component detected in the frequency characteristic.

8. The semiconductor manufacturing apparatus according to claim 7, wherein the end-point acquisition unit sets a state where there is no frequency component equal to or larger than a predetermined intensity at all in the frequency characteristic as a time point when there is no frequency component.

* * * * *